United States Patent [19]

Moslehi

[11] Patent Number: 5,405,444
[45] Date of Patent: Apr. 11, 1995

[54] PROCESS CHAMBER PURGE MODULE FOR SEMICONDUCTOR PROCESSING EQUIPMENT

[75] Inventor: Mehrdad M. Moslehi, Dallas, Tex.

[73] Assignee: Texas Instruments Incorporated, Dallas, Tex.

[21] Appl. No.: 151,082

[22] Filed: Nov. 12, 1993

Related U.S. Application Data

[62] Division of Ser. No. 634,676, Dec. 27, 1990, Pat. No. 5,275,976.

[51] Int. Cl.⁶ .............................................. C23C 16/00
[52] U.S. Cl. ..................................... 118/725; 118/715; 118/724
[58] Field of Search ......................... 118/715, 724, 725

[56] References Cited

U.S. PATENT DOCUMENTS

| | | | |
|---|---|---|---|
| 4,503,807 | 3/1985 | Nakayama | 118/719 |
| 4,736,705 | 4/1988 | Weyburne | 118/728 |
| 4,792,378 | 12/1988 | Rose | 156/345 |

*Primary Examiner*—Richard Bueker
*Attorney, Agent, or Firm*—Mark A. Valetti; Douglas A. Sorensen; Richard L. Donaldson

[57] ABSTRACT

A process chamber purge module (56) is provided, including a stack module (60) and a process chamber liner (62). The stack module comprises a plurality of quartz plates (100, 110, and 116) having flow apertures to permit radial and axial flow of a purge gas to the backside of a semiconductor wafer (18). The process chamber liner (62) isolates the process chamber walls from the process chamber process environment by flowing between the liner and the walls a portion of the purge gas. Process chamber liner (62) comprises a quartz cylindrical collar that operates to decouple the process chamber (16) process environment (20) from the process chamber collar walls (42). The stack module (60) decouples the process chamber optical/vacuum quartz window (64) from the semiconductor wafer (18) during a heated semiconductor wafer fabrication process. By flowing purge gas to the backside of the semiconductor wafer (18), the present invention prevents reactive process gas interaction with the semiconductor wafer backside.

17 Claims, 6 Drawing Sheets

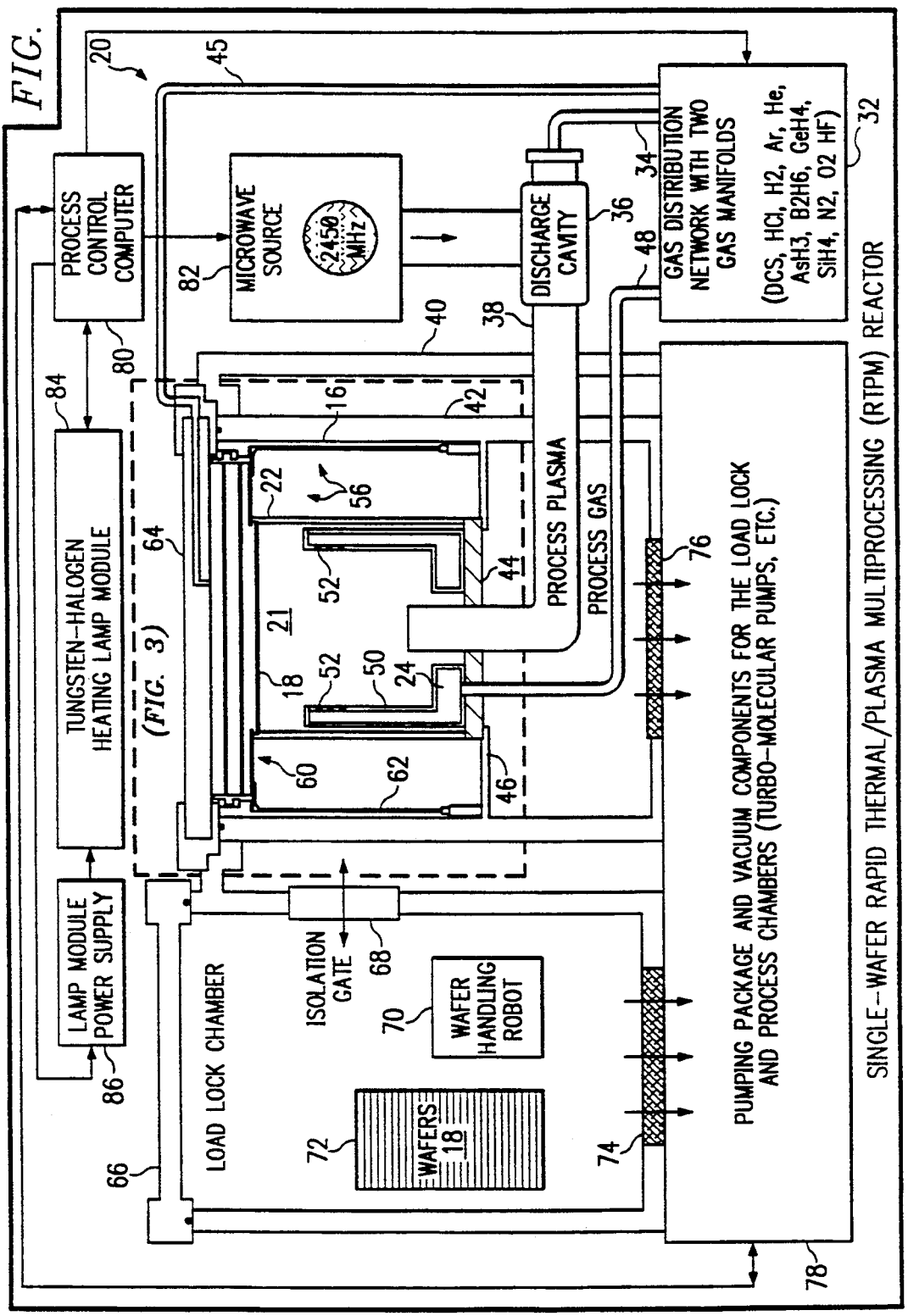

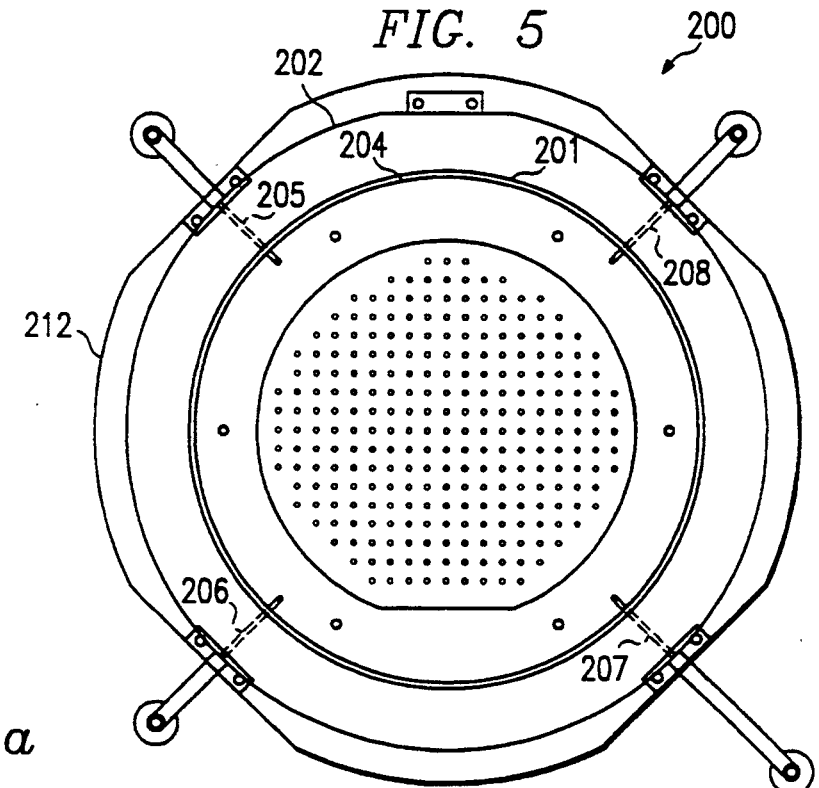
FIG. 5
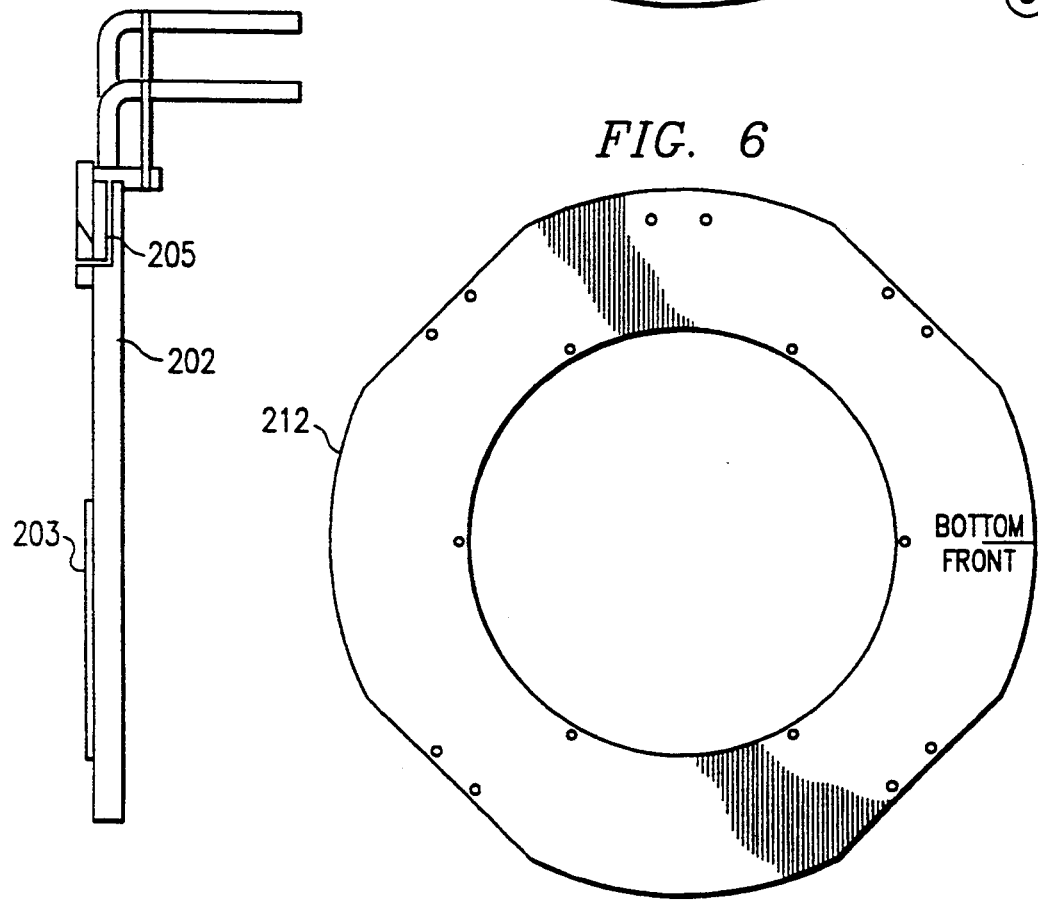
FIG. 5a
FIG. 6

PROCESS CHAMBER PURGE MODULE FOR SEMICONDUCTOR PROCESSING EQUIPMENT

This is a division of application Ser. No. 07/634,676, filed Dec. 27, 1990, now U.S. Pat. No. 5,275,976.

TECHNICAL FIELD OF THE INVENTION

The present invention generally relates to semiconductor wafer processing, and more particularly to a process chamber purge module to prevent semiconductor wafer backside depositions and to maintain chamber cleanliness in semiconductor processing reactors.

BACKGROUND OF THE INVENTION

Semiconductor wafer manufacturers generally use a heating lamp or hot plate module for thermal process activation and depositing various films on semiconductor wafers. Film deposition processes such as chemical-vapor deposition (CVD) are used for formation of epitaxial semiconductor layers, dielectrics (e.g., silicon nitride, silicon oxide, or oxynitrides), metals (e.g., tungsten), polycrystalline silicon, and doped oxides. These processes may use suitable reaction gases with thermal and/or plasmas activation.

A lamp-heated system for semiconductor wafer processing generally includes a lamp heat source separated by an optically transparent material such as the quartz window from a vacuum process chamber where the wafer resides. The quartz optical/vacuum window provides a transmission path for the lamp optical energy while maintaining a vacuum and/or a controlled environment in the process chamber. The quartz window is usually transparent to infrared radiation up to a wavelength of approximately 3.5 $\mu$m. Plasma arc lamps typically produce most of their output optical energy in the visible and ultraviolet range, while tungsten halogen lamps usually produce energy in the near infrared range (e.g., 0.7 to 3.5 $\mu$m). These wavelengths are essentially within the transmission wavelength range for quartz, so direct lamp energy radiation typically does not significantly heat the window. However, the vacuum/optical quartz window can be significantly heated by the radiative and convective heat losses from the heated wafer.

Within most processing reactor chambers, the wafer sits on low thermal mass pins at a small distance from the quartz window during processing. The wafer is directly heated from the backside (assuming face-down processing) by the lamp energy that passes through the optical/vacuum quartz window. While it is heated the wafer radiates thermal energy. That energy dissipated by radiative and convective losses can heat up different parts of the reactor, including the optical/vacuum quartz window. In particular, when the wafer radiates this energy, the radiative energy wavelength may extend much beyond 3.5 $\mu$m. This is beyond the transmission wavelength range of the quartz optical/vacuum window. As a result, the window (usually 0.5" thick) absorbs a relatively large fraction of the radiant heat energy dissipated from the semiconductor wafer. The quartz window usually has a large thermal mass due to its high heat capacity, large window thickness, and poor thermal conductivity.

As the quartz window becomes heated during semiconductor wafer processing, not only does layer deposition takes place on the wafer, but also deposits are formed on the inner surface of the heated quartz window. For high-temperature processes such as single-wafer epitaxy, the heated wafer (with a temperature of 850°–1100° C.) can heat up the quartz window to temperatures as high as over 500° C.

As soon as deposits (e.g. silicon deposition during epitaxial growth) start to form on the window, the quartz window becomes less transparent and absorbs more thermal energy from the lamp. This results in further heating of the window and formation of thicker deposits on the window. Moreover, when operating a constant lamp power output, a runaway situation may occur. As the quartz window absorbs more energy directly from the lamp, window heating becomes worse, and more deposits may be formed on the window. Ultimately, good process uniformity and process reliability become unattainable. Window deposits can degrade deposition process uniformity on wafer and also cause wafer temperature measurement errors. They can also increase particle generation in the process environment.

There are two known ways to correct these problems. The first is to perform a labor-intensive and time consuming wet chemical, cleaning procedure on the coated window after a few process runs. This requires disassembling the process chamber and degrades equipment up-time. Alternatively, a manufacturer may actually perform in-situ dry cleaning process using a plasma or other activated cleaning gas in the chamber after the process terminates. This procedure, however, may degrade the window surface quality in some applications. The in-situ cleaning process may have to be performed after each wafer processing run, resulting in reduced overall wafer processing throughput.

Another problem in many semiconductor wafer processing applications relates to known methods for depositing different material layers using techniques such as chemical-vapor deposition. Systems that use low-thermal mass pins to support the wafer deposit material everywhere on the wafer, including its backside, because the heated wafer is totally immersed and exposed in the reactive process environment. For different deposition applications, a manufacturer may desire to deposit the film only on the front of the wafer and to prevent wafer backside deposition. Preventing material deposition on the semiconductor wafer backside usually simplifies the overall semiconductor device fabrication sequence.

One approach to prevent backside deposition is to clamp the wafer directly against the quartz window. This prevents active gases from getting on the wafer back side, but clamping the wafer to the quartz window eliminates the low thermal mass advantage of having the semiconductor wafer sit on the pins and heated by optical radiation. The clamping approach also reduces the maximum heat-up and cool-down rates which can be achieved. As opposed to a thin semiconductor wafer, the quartz window has a large thermal mass because it is a poor thermal conductor and is approximately 8–10" in diameter and $\frac{1}{2}$" thick. If the wafer (e.g. 6" wafer) is clamped to the window, it becomes an integral part of the large thermal mass of the quartz window. Additionally, in this method the wafer directly contacts the window and dissipates heat both by direct conductive losses into the quartz window and radiative losses. As a result, the fast thermal cycling and rapid thermal processing features will be lost by the clamping method.

Thus, there is the need for a method and apparatus that eliminate the problem of unwanted wafer backside deposition without the use of a wafer clamping mechanism which can further heat the process chamber quartz window. There is the need for a method and apparatus that eliminate wafer backside deposition without coupling the wafer thermal mass to the quartz window thermal mass.

Another problem with conventional systems is that in many deposition processes, the reactive process gas and/or plasma environment interacts with the process chamber walls. If the process chamber walls are metallic, the interaction with metallic substances may contaminate the process environment and wafer surface. Even if it is possible to perform in-situ cleaning of the chamber after deposition, the cleaning process may remove metallic impurities from the wall. In subsequent runs, this may cause equipment-induced cross-contamination on the wafers.

The chamber and window deposition problems make it necessary to periodically clean the process chamber to remove deposits from the process chamber and quartz window walls. Some systems accommodate in-situ cleaning, for instance, after each wafer run or after a known number of wafer runs. In such a process, the operator introduces a special chemical cleaning gas which may or may not be activated by a plasma. In this type of process, the in-situ cleaning chemistry interacts everywhere in the chamber and etches off the film deposits on the chamber window and walls. Cleaning may, however, adversely interact with the surface area of the metal chamber and allow metallic impurities to more easily leave the process chamber walls to contaminate the wafer. This cross-contamination problem makes it necessary to optimize the in-situ cleaning process such that it does not attack the metallic components in the process chamber.

Thus, there is a need for a method and system that reduces or eliminates the potential for process and wafer cross-contamination.

There is the need for a method and apparatus that eliminates or substantially reduces the need for process chamber wall cleaning to thereby minimize equipment-induced contamination of wafers during device processing.

SUMMARY OF THE INVENTION

The system and method of the present invention provide inventive subject matter to overcome the problems and satisfy the needs already mentioned. The present invention provides a process chamber purge module for a semiconductor processing reactor that substantially eliminates or reduces disadvantages and limitations associated with prior methods and devices for fabricating semiconductor wafers.

The apparatus of the present invention comprises a multilayer stack module that fits within the process chamber of a semiconductor wafer processing reactor. The quartz stack module contains a plurality of layers of quartz plates separated by predetermined volumes or spaces in between the layers. In the preferred embodiment, the layers comprise cylindrical disks that are bonded or fused together at the perimeter and which have suitable gas flow passageways or holes cut in each of the layers. As a result, the stack module permits the flow of a purge gas from one side of the stack module through to the other side. The stack module receives a purge gas (e.g., an inert gas, hydrogen, etc.) and directs a portion of the purge gas to a predetermined area within the process chamber that is configured to receive a semiconductor wafer. The invention also includes a purge liner that makes contact with the stack module within the process chamber. The purge liner comprises a pure inert material, such as quartz, and serves as a liner or shield between the processing reactor chamber wall and the interior (process environment) of the process chamber itself. The process chamber liner also receives a portion of the purge gas and directs the portion that it receives between the process chamber liner and the process chamber walls.

In the preferred embodiment, a passageway for the purge gas is placed through the optical/vacuum quartz window of semiconductor wafer processing reactor process chamber. The stack module is positioned within the process chamber between the optical/vacuum quartz window and the region containing the semiconductor wafer. This serves to isolate this quartz window from the semiconductor wafer and restricts radiative, convective, and conductive heat transfer from the semiconductor wafer to the optical/vacuum quartz window. As a result of decoupling the semiconductor wafer from the optical/vacuum quartz window in this manner, the heating problems-associated with prior methods and apparatuses for fabricating semiconductor wafers are overcome.

Another aspect of the present invention is a method for purging reactive process gases from a predetermined portion of a semiconductor wafer processing reactor process chamber. The method comprises the steps of injecting a suitable purge gas into the process chamber. A portion of the purge gas is received and directed to a predetermined portion of the semiconductor wafer thereby purging the reactive process gases from that area of the semiconductor wafer. The remaining portion of the purge gas is directed to that portion of the process chamber nearest the process chamber walls. By purging the reactive process gases from the semiconductor wafer backside, process gases cannot interact with the purged area of the semiconductor wafer. This eliminates undesirable wafer backside interactions and allows the fabrication process to more discretely focus on the desired area (front side) of semiconductor wafer. This technique is used by this invention in order to prevent depositions on the wafer backside during a chemical-vapor deposition process. By purging process gases from the region near the process chamber walls, the method prevents interaction of the process gases with the process chamber wall and thereby eliminates cross-contamination of the semiconductor wafer due to the process chamber walls. This approach also eliminates depositions on the process chamber walls.

A technical advantage of the present invention is that it accomplished the purposes of decoupling the quartz window from the heated semiconductor wafer and of preventing backside deposition on the semiconductor wafer, while at the same time taking advantage of the low thermal mass properties of the semiconductor wafer. This is due to the fact that this invention does not require wafer clamping in order to prevent wafer backside depositions.

Another technical advantage of the present invention is that it provides a method and apparatus that reduces or eliminates the possibility of process and wafer cross-contamination due to metallic process chamber walls; it also minimizes the need for cleaning the process chamber walls. This is because when using the method and apparatus of the present invention, process gases are purged from the process chamber walls and do not interact therewith.

BRIEF DESCRIPTION OF THE DRAWINGS

The invention, as well as modes of use and further advantages, is best understood by reference to the following description of illustrative embodiments when read in conjunction with the accompanying drawings, wherein:

FIG. 2 provides a side schematic diagram of a single-wafer rapid thermal/plasma multiprocessing reactor incorporating a preferred embodiment of the present invention;

FIGS. 5, 5a and 6 through 9 are schematic illustrations of an alternative embodiment of the present invention.

DETAILED DESCRIPTION OF THE INVENTION

For a more complete understanding of the present invention and for further advantages thereof, reference is now made to the following detailed description, taken in conjunction with the accompanying FIGURES. This application is related to concurrently filed, U.S. patent application Ser. No. 634,842 filed on Dec. 27, 1990, entitled "Method and Apparatus for Eliminating Cross-Contamination in Semiconductor Wafer Processing," (now abandoned), which is hereby expressly incorporated by reference in its entirety.

Figure 1:
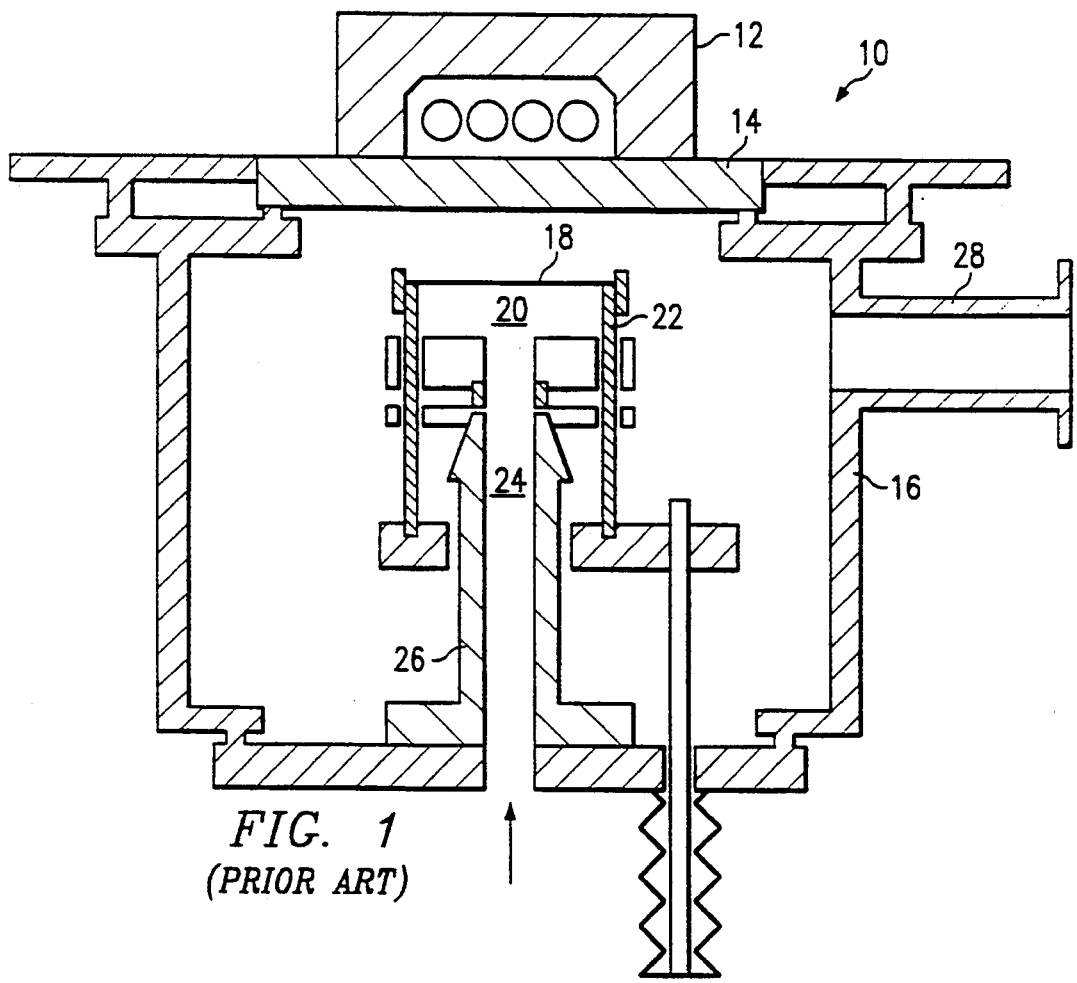
FIG. 1 illustrates a single-wafer semiconductor processing chamber according to the prior art.

FIG. 1 shows a side schematic view of a typical single-wafer lamp-heated system for semiconductor wafer processing. According to FIG. 1, the single-wafer device fabrication reactor 10 includes heating lamp module and reflector 12 which transmits optical energy through transparent window 14 of process chamber 16 for heating semiconductor wafer 18. Semiconductor wafer 18 rests above process environment 20 supported by support pins 22. Within process chamber 16, process gas 24 travels axially through gas injection channel 26 to reach process environment space 20 and react with wafer 18. Exhaust or pumping port 28 provides a flow path for injected process gases to exit process chamber 16.

Figure 4:
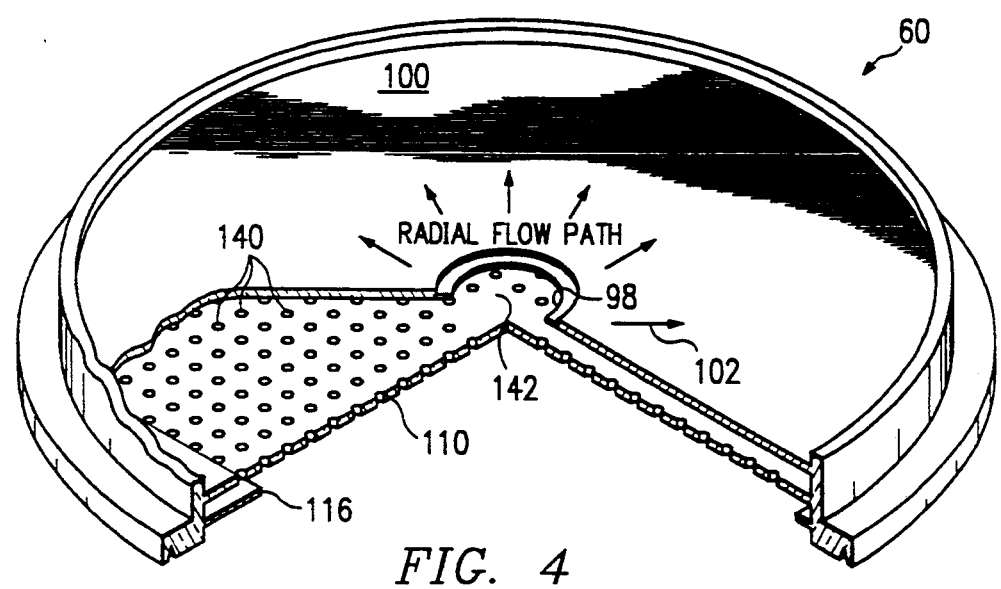
FIG. 4 illustrates a partially cut-away perspective view of the purge module according to a preferred embodiment of the present invention.
Figure 3:
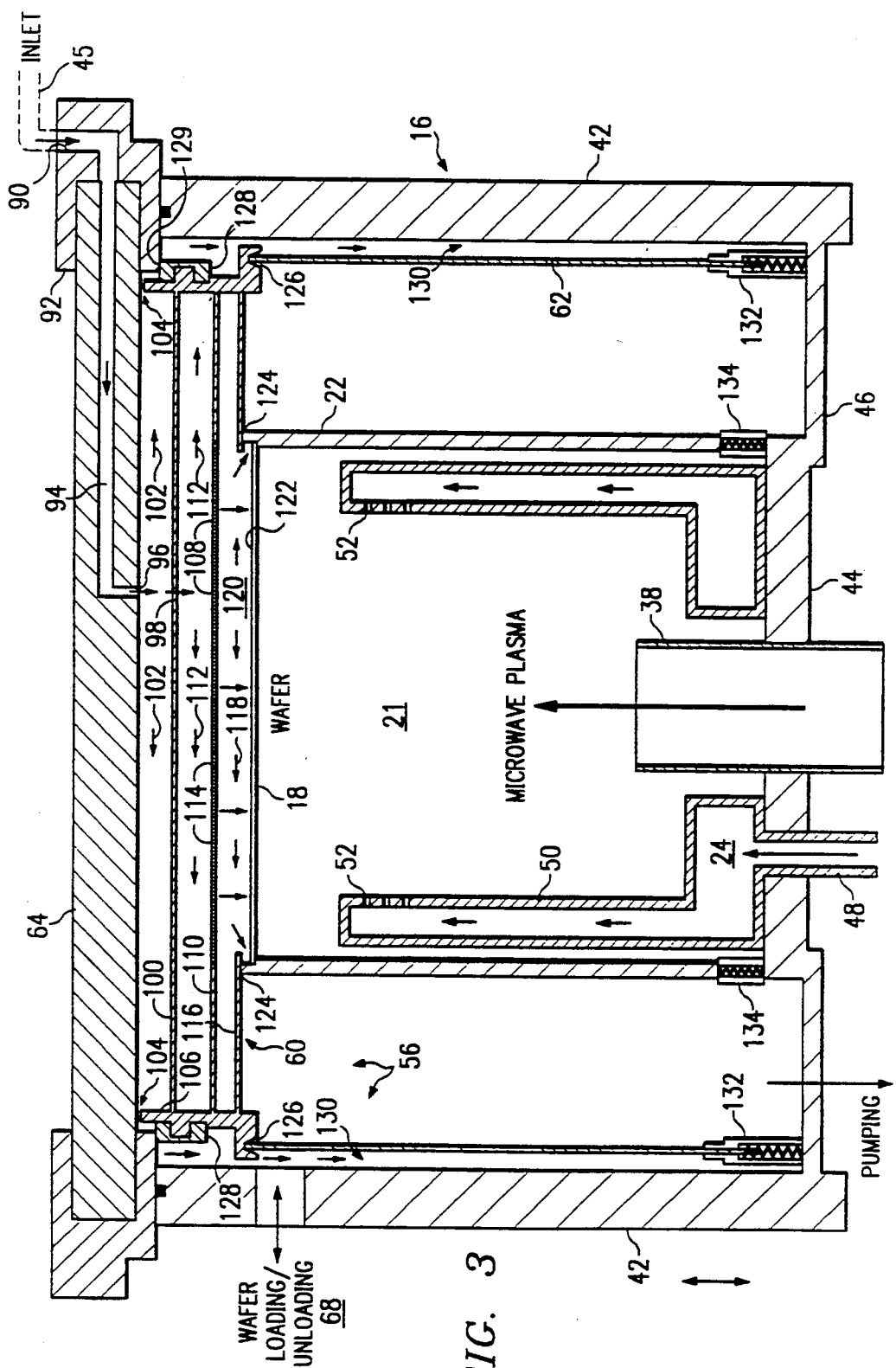
FIG. 3 provides a more detailed side schematic view of the present invention that FIG. 2 illustrates.

Lamp-heated deposition systems may be used for many applications including chemical-vapor deposition (CVD) of various materials such as amorphous silicon, polycrystalline silicon, silicon dioxide, silicon nitride, tungsten, titanium nitride, and epitaxial silicon on semiconductor wafers. As already mentioned, the conventional system shown in FIG. 1 does not address or take into consideration the problems of heating of large thermal mass optical/vacuum quartz window 14 by heated semiconductor wafer, film deposits on quartz window 14, wafer 18 backside deposits, and wafer or process cross-contamination due to impurities from the walls of process chamber 16. The present invention, which FIGS. 2 through 4 illustrate, solves these problems.

FIG. 2 illustrates a single-wafer rapid thermal/plasma processing reactor 10 using a preferred embodiment of the purge module 56 of the present invention. Processing reactor 10 includes gas distribution network 32 which can provide process plasma through plasma gas inlet 34 to plasma discharge cavity 36. Discharge cavity 36 generates activated plasma and transmits plasma through extended plasma discharge tube 38. Plasma discharge tube 38 penetrates reactor wall 40 and process chamber wall 42 to enter process chamber 16 and passes through counter electrode 44 into process environment space 20. Gas distribution network 32 may also provide process gases through nonplasma process gas injection channel 48, which also passes through reactor wall 40 and process chamber wall 42 to enter process chamber 16 and pass through counter electrode 44. Support brackets 46 attach to the interior of process chamber wall 42 to support counter electrode 44. Additionally, the present invention includes purge gas line 45 that flows from gas distribution network 32.

Counter electrode 44 supports wafer support pins 22 and process gas injection module 50. Process gas 24 passes through injection module 50 and out into process environment space 20 through injection holes 52. Support brackets 46 also support process chamber liner 62 which adjoins stack module 60. Stack module 60 of the present invention is positioned between modified optical/vacuum quartz window 64 and semiconductor wafer 18.

Process chamber wall 42 is vertically movable by way of bellows (not shown) and provides a path or clearance for moving semiconductor wafers from vacuum load-lock chamber 66 into process chamber 16. Semiconductor wafers 18 enter and exit process chamber 16 via isolation gate 68 which opens to allow wafer handling robot 70 to remove semiconductor wafers 18 from wafer stack 72 and pass them into process chamber 16. To maintain vacuum or a controlled environment within process chamber 16 and load lock chamber 66, vacuum pumping is performed through pump down outlets 76 and 74, respectively, by pumping package 78.

At the upper right-hand corner of FIG. 2, process control computer 80 is shown to control microwave source 82, which provides plasma discharge energy to discharge cavity 36, and lamp module power supply 86, which controls tungsten heating lamp module 84. Heating lamp module 84 also provides a direct input to process control computer 80 (e.g., temperature and light intensity sensor outputs).

FIG. 3 provides a more detailed side schematic diagram of purge module 56 of the present invention. Process chamber 16 is modified by the addition of modified optical/vacuum quartz window 64, which window mount 92 holds. Within window mount 92 and attached to purge gas line 45 appears purge line inlet 90, which provides a flow path through purge line 94 to purge line outlet 96 connected to the process environment. Stack module 60 and process chamber liner 62 form the integral elements of purge module 56. Purge line outlet 96 opens to permit flow of a suitable purge gas through purge flow aperture 98 located at the center of upper plate 100 and through radial purge flow path 102 across upper plate 100 of stack module 60. Stack module 60 is held against the optical/vacuum quartz window by a few brackets 128. A radial purge escape path 104 for purge gas appears between cylindrical wall 106 and modified window 64. From purge flow aperture 98, flow continues to, and is redirected by, solid perforated area 108 of middle plate 110 of stack module 60. This area contains an array of holes which act as purge gas shower head. As a result, purge gas flow continues radially along middle radial flow path 112 and purge gas flows axially through flow distribution apertures 114. From flow distribution apertures 114, flow continues along distributed purge gas flow path 118 to purge gas flow space 120. Purge gas flow space 120 is bounded from below by semiconductor wafer 18 and lower plate 116 of stack module 60.

Purge gas flow passes through the opening or small gap between semiconductor wafer 18 and lower plate 116 around wafer pins 22. Wafer pins 22 join lower plate 116 at lower plate-pin junction 124. During wafer processing, lower plate 116 acts as a self-aligned stopper for the spring-loaded 134 pins 22. Process chamber liner 62 of purge module 56 joins stack module 60 at purge liner-purge module junction 126. This occurs when process chamber collar is raised and seals against the top quartz window holder 92. Purge module support brackets 128 hold stack module 60 firmly in place within process chamber 16. From escape path 104 a portion of purge gas flows past purge module support bracket 128 and through liner purge gas flow space 130 between process chamber liner 62 and process chamber wall 42. Liner spring supports 132 uniformly provide spring pressure to process chamber liner 62 to maintain pressure and rough seal at purge liner-purge module junction 126. To maintain positive pressure at lower plate-pin Junction 124, pin spring support 134 exerts spring pressure upward. This happens during wafer processing when the chamber collar is in the up position.

Modified quartz window 64 is approximately $\frac{1}{2}$" thick (and about 10" in diameter for 6" wafer processing), and is sufficiently strong to withstand the pressure differential between the atmosphere and the chamber vacuum. A channel 94 of fairly small size, typically 1/16" or $\frac{1}{8}$" in diameter modifies quartz window 64. One or more channels may be used to accomplish the purposes of the present invention., but one channel is usually sufficient. Purge line outlet 96 appears at or near the radial center of modified quartz window 64, however, placements other than exact radial center may provide adequate gas flow and be desirable in some processing chambers. Through purge line 94 and from purge outlet 96 flows an inert gas such as argon, helium or xenon (other gases such as hydrogen may be used). The selection of the inert purge gas is not critical to the invention, however, the gas most compatible with the deposition process can be selected. For example, epitaxial silicon deposition uses large amounts of hydrogen in the process as one of the process gases. As a result, for epitaxial silicon deposition, hydrogen is the preferred purge gas since it is one of the process gases, it changes process chemistry only minimally(because it acts as a carrier gas), and it does not interact detrimentally with the semiconductor wafer to cause any depositions by itself.

Stack module 60 of purge module 56 is a solid fused quartz device having several components and a low thermal mass. Momentarily referring to FIGS. 3 and 4 together, upper plate 100, middle plate 110 and lower plate 116 are selected to be about 1/16" in thickness. Upper plate 100 has purge flow aperture 98 at its center. The dimension of flow aperture 98 is selected according to the amount or fraction of purge gas the user desires to have flow radially in path 102 towards the liner space 130.

In an alternative embodiment of the invention, purge flow aperture 98 may be made large and a variety of plugs having identical outside diameters, but with apertures of varying sizes may be configured to fit in aperture 98. With such a design, it is possible to vary sizing and flow conductance of the hole for different applications, while the other dimension of the plug remains the same.

Middle plate 110 has an array of smaller holes 140 (shower head design) and acts as a purge gas shower head. Middle plate 110 does not have any holes near the center 142 in order to prevent the purge gas from having a jet cooling effect on the area capable of receiving wafer 18.

Space exists between the thick quartz window plate 64 and the upper plate 100, between the upper plate 100 and middle plate 110, and between the middle plate 110 and the backside of the wafer 18. Gaps between upper plate 100 and middle plate 110 and between middle plate 110 and lower plates 116 are selected for a specific flow division between the amount of purge gas that passes through purge module 60 and the amount that flows outside process chamber liner 62 past chamber wall 42.

Returning to FIG. 3 only, stack module 60 is fixed at the top part of process chamber 16. Purge module support brackets 128, which hold stack module 60 in place, do not necessarily go all the way around the interior of process chamber 16, but are only fixed brackets that hold stack module 60 in place. Because they do not form a continuous ring around stack module 60, path 104 exists for gas flow from radial flow path 102 to the outer part of process chamber liner 62.

Typically the thickness of process chamber liner 62 is less than about 1/16", but may be between 1/32" and $\frac{1}{8}$". A small gap exists between the process chamber liner 62 and the chamber wall 42. This allows a fraction of the purge gas to pass between process chamber liner 62 and the chamber wall 42. Process chamber wall 42 is usually a water-cooled metallic wall (e.g., stainless steel or aluminum).

Process chamber liner 62 is cylindrical and seals near lower plate 116. Liner spring supports 132 support process chamber liner 62 and could either go all around the base of process chamber liner 62 or be just a few places beneath the liner. When the process chamber is raised in order to seal the process environment, process chamber liner 62 is pressed upward against lower plate 116 by spring support 132 to establish an inner "chamber" that eliminates essentially all flow of process gases to process chamber wall 42. Although the seal is not necessarily a perfect vacuum-tight seal, it prevents any liner purge flow from escaping into the process environment 20. Process chamber wall 42 is supported by bellows (not shown) that retract to allow wafer robot 70 to transfer wafers between process chamber 16 and loadlock chamber 66. When process chamber wall 42 moves vertically downward, process chamber liner 62 and wafer pins 22 also move downward. The wafer support pins 22 are supported by springs 134. When the process chamber wall 42 comes down, wafer support pins 22 do not move downward as much as does process chamber liner 62, but hold wafer 18 up so robot 70 has access to load or remove wafer 18 without any interference due to chamber collar 42.

When process chamber wall 42 moves upward, wafer support pins 22 are first stopped by lower plate 116 at junction 124. The dimension of the center opening at lower plate 126 is selected such that the wafer edge 18 overlaps slightly. The overlap could be in the range of 0 to less than ⅛". There is also a height difference between the back side of the wafer 18 and lower plate 116 when pins 22 engage lower plate 116. The optimum size of this height difference depends on many factors, including the necessary radial gas flow rate in purge flow space 120. In general, however, the difference is selected to be anywhere from 0.5 to 2 mm.

As the purge gas comes in to process chamber 16, a fraction of the gas flows radially and the rest flows downward into the space between upper plate 100 and middle plate 110. The fraction of the purge gas that flows radially escapes between process chamber liner 62 and the process chamber wall 42. The relative fractions, between flow past wafer 18 and flow in space 130 depends on the net flow conductance for the gas between upper plate 100 and the wafer 18-lower plate 116 injunction. The only path for the wafer backside purge gas exit is through the overlapping gap between wafer 18 and lower plate 116.

Once the purge gas passes the wafer 18-lower plate 116 junction, it joins the process gases in process environment space 20. These gases join the purge gas from between process chamber liner 62 and wall 42, all of which are pumped out of process chamber 16. The fraction of gas which comes between wafer 18 and lower plate 116 prevents back diffusion of the reactive process gases from the process environment 20 towards the window 64 and wafer backside 118. Examples of the reactive process gases include TEOS in oxide deposition, silane in polysilicon deposition processes, and dichlorosilane (DCS) in epitaxial silicon growth.

The present invention decouples window 64 and wafer backside 118 from the process environment. The window and backside only see hydrogen or inert gas and no film deposition occurs in those regions. Additionally, the purge gas that flows laterally toward the process chamber liner 62 and the process chamber wall 42 tends to cool down quartz window 64. Although the wafer 18 dissipates power by radiation as well as convective heat loss to the gas, for a given temperature, this loss can be compensated for by simply adjusting the lamp power. Thus, for a given result, it is only necessary to adjust the power input to achieve the desired wafer temperature. The purge stack 56 prevents direct heating of the high thermal mass optical/vacuum quartz window 64 due to the thin low thermal mass quartz plates in the stack and due to the cooling effects of the purge gas.

The present invention also decouples the process chamber wall 42 from the process environment 20. The purge gas flow between process chamber liner 62 and chamber wall 42 prevents process gases from back diffusing into that region and interacting with the chamber walls. As a result, the potential for process cross-contamination is significantly reduced.

Another advantage of the present invention is that the contact seal between lower plate 116 and process chamber liner 62 prevents escape of the process gas into space between process chamber liner 62 and wall 42. This also prevents the liner purge gas from interacting with the process environment 20.

Also, since process chamber wall 42 is typically cooled by water or some other coolant medium, the flowing purge gas provides a convective and/or conductive heat transfer path, to cool chamber at the liner. Hence, the liner is partially cooled as a result of the chamber cooling because of the convective heat transfer properties of the gas. Typical purge gas flow rates entering channel 94 are in the range of 100 sccm to as high as 20 slm. The precise flow depends on factors such as process pressure and the type of film deposition process. For example, an epitaxial growth process may employ 100–500 sccm of dichlorosilane (DCS) and about 15 slm of process hydrogen at a total pressure of 20 Torr. As a result, this process can employ 1–5 slm of hydrogen for purge gas.

FIG. 5 illustrates an alternate embodiment 200 of purge module 56 without a purge liner 62. The alternative embodiment 200 includes a thick optical/vacuum quartz window 202 positioned above thin (e.g., 1 mm thickness) quartz window 204 and separated by a small distance of approximately 1 mm. Support plate 212 holds the thick quartz plate 202 and thin quartz plate 204 in place. Thin quartz plate 204 is fused at its edge to thick quartz plate 202 and has a diameter slightly smaller than thick quartz plate 202. In the alternative embodiment 200, thick quartz plate 202 has a 10" diameter and a ½" thickness (for 6" wafer processing). Thin quartz plate 204 is 1 mm thick and its diameter is approximately 8" or less. Thick quartz plate 202 has four purge gas inlet/outlet channels 205, 206, 207 and 208, each of which connects to a purge gas line or a pumping line. FIG. 5a is a side view of thick quartz plate 202 showing the position of channel 205, for example. Purge inlet/outlet channels 205 through 208 connect from support plate 212 to the edge 201 of the thick optical/vacuum quartz plate 202 and extend for a small radial dimension from fused edge 201 and then penetrate vertically into process chamber 16. A purge gas flows into channels 205 through 2(J8. Purge channels 205 through 208 may be connected together in pairs either diagonally or between neighboring holes. Two purge channels may be used as purge gas inlet and two other purge channels may be used as pumping ports to remove the excess purge gas from the confined cavity formed between the two quartz plates. The inlet purge gas may be hydrogen or inert gas. When two purge inlet/outlet holes are connected, the other two may be connected to a pumping package to pump any excess purge gas out of chamber 16. The purge cavity 203 formed below the thick quartz plate 202 and above the thin quartz plate 204 receives purge gases from at least one of channels 205 through 208. Thin quartz plate 204 has a shower head pattern design 220 comprising array of holes that allow at least a portion of the purge gas to penetrate to the semiconductor wafer 20 which is positioned with its back side a slight distance from the thin quartz plate 204. This configuration permits bleeding of a fraction of the purge gas toward the wafer 20 and prevents deposition on optical window 64 (corresponding to thick quartz window 202) as well as on wafer backside. Additionally, placing semiconductor wafer 20 only a slight distance from thin quartz plate 204 prevents coupling the thermal mass of thin quartz plate 204 with the thermal mass of semiconductor wafer 20. However, the semiconductor wafer may also be clamped against thin quartz window 204.

The alternative embodiment of FIGS. 5 through 8 provides a simpler configuration than the preferred embodiment which has more quartz plate layers.

Figure 8:
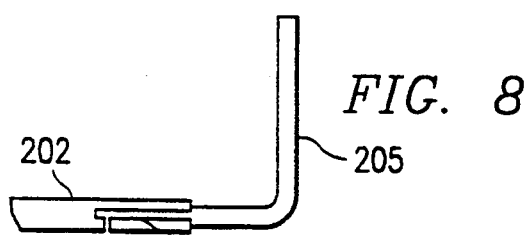
Figure 7:
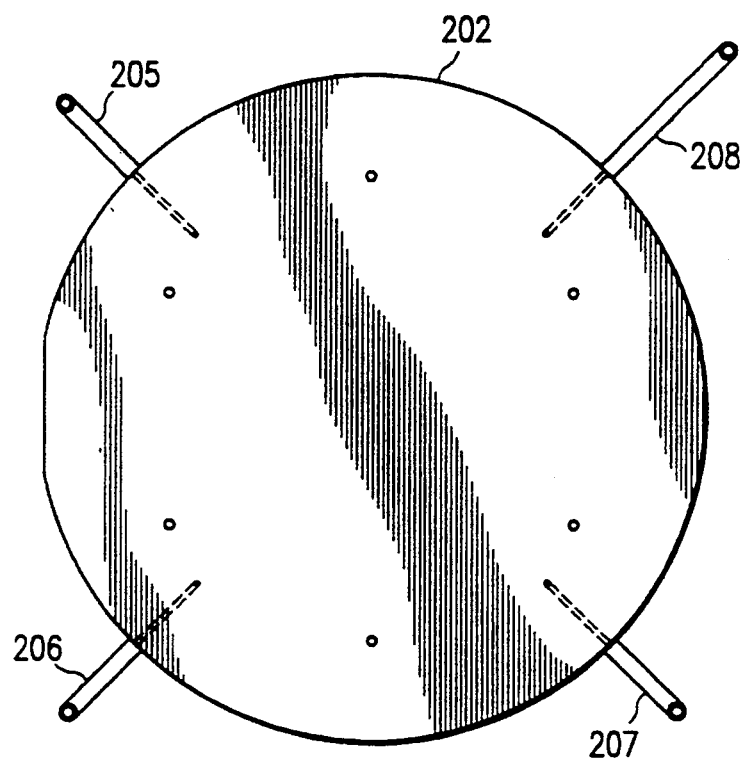
Figure 9:
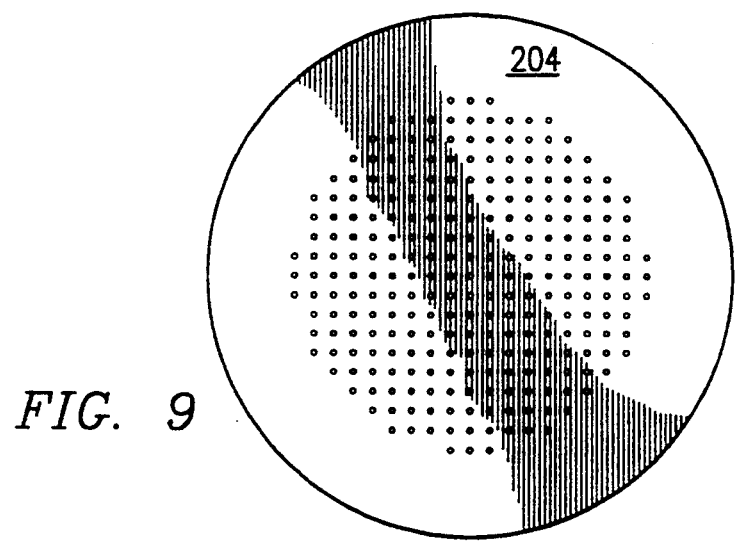

FIGS. 6 through 9 illustrate the component parts of the alternative embodiment. FIG. 6 provides a top-down view of a quartz and vacuum seal support 212 useable with the alternative embodiment to support thick quartz plate 202. FIGS. 7 and 8 show top-down perspectives of the construction of thick quartz plate 200 and associated purge gas flow channels 204 through 210. FIG. 9 shows a top-down perspective of thin quartz plate 202 including showerhead design 220. The diameter of the perforated area is chosen to be somewhat smaller than that of the wafer.

Figure 10:
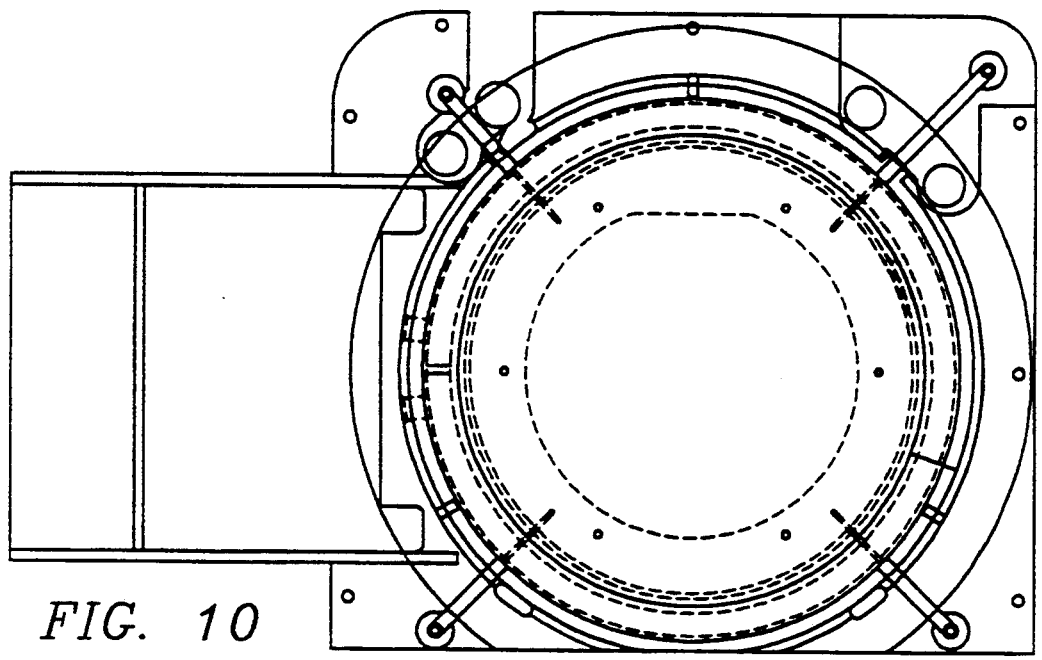
FIG. 10 shows a top view of a vacuum processor chamber implementing the alternative embodiment of the present invention.

FIG. 10 shows a top view of a vacuum processor chamber 16 implementing the alternative embodiment of the present invention.

Figure 11:
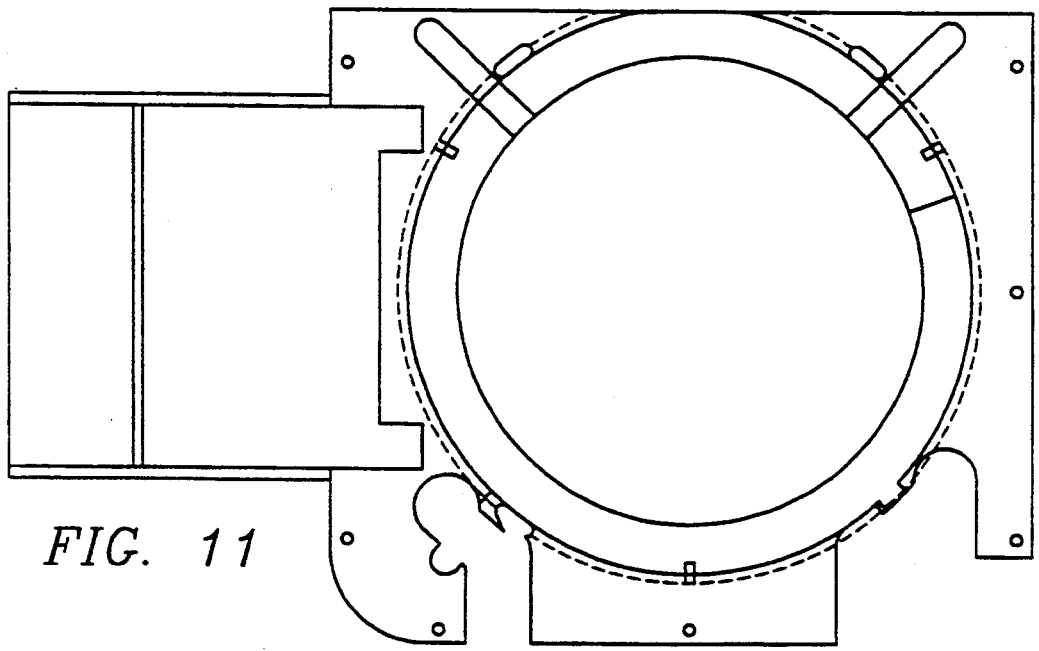
FIG. 11 shows the preferred processor top fitting for the alternative embodiment of the present invention.

FIG. 11 isolates from the top view of FIG. 10 the preferred processor top fitting for the alternative embodiment of the present invention.

Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. A module for placement within a semiconductor device fabrication reactor process chamber and positioned on the back-side of a semiconductor wafer onto which there is to be deposited material as a result of reactive gases surrounding said semiconductor wafer, comprising:

a layered stack of windows and operable for passing heat energy therethrough;

channels for allowing a purge gas to flow from one window to the window in the next adjacent layer;

spacers for maintaining a gap between said window layers so that a portion of said gas can move radially and axially within said gap;

inlet and outlet ports within said module so as to receive said purge gas at said inlet and to pass at least a portion of said received purge gas via said outlet into said process chamber.

2. The module as described in claim 1, further comprising a process chamber liner to isolate said semiconductor wafer from said process chamber walls, thereby reducing cross-contamination between said semiconductor wafer and said process chamber wall.

3. The module as described in claim 1, wherein said radial flow distribution apertures are configured to direct flow radially and axially to the semiconductor wafer, thereby purging said wafer of reactive process gas with said purge gas.

4. The module of claim 1, wherein said stack module comprises an optically transparent material.

5. The module as described in claim 1, wherein said stack module comprises a quartz material.

6. The module of claim 1, wherein said process chamber liner comprises a pure inert material.

7. The module as described in claim 2, wherein said process chamber liner comprises a quartz material.

8. The module as described in claim 1, wherein said radial and axial flow, of said purge gases operates to decouple the optical window of the process chamber from the semiconductor wafer.

9. The module as described in claim 1, wherein said module comprises a variable purge gas flow aperture to permit variations in gas flow through said module.

10. A system for processing a semiconductor wafer that thermally decouples the wafer from a quartz window in a process chamber of a semiconductor wafer processing chamber of a semiconductor wafer processing reactor and that decouples the process chamber walls from the process environment, said system comprising:

a semiconductor wafer processing reactor, said reactor comprising a process chamber having a Hartz window; and a layered stack of windows and operable for passing heat energy therethrough;

channels for allowing a purge gas to flow from one window to the window in the next adjacent layer;

spacers for maintaining a gas between said window layers so that a portion of said gas can move radially within said gap;

and inlet and outlet ports within said module so as to receive said purge gas at said inlet and to pass at least a portion of said received purge gas via said outlet into said process chamber.

11. The system of claim 10, further comprising a process chamber liner for isolating said semiconductor wafer from said process chamber walls, thereby reducing cross-contamination between said semiconductor wafer and said process chaser wall.

12. The system of claim 10, wherein said stack module comprises a plurality of flow apertures to permit radial and axial purge gas flow distribution to said semiconductor wafer.

13. The system of claim 10, wherein said radial and axial flow distribution apertures are configured to direct flow radially and axially to a semiconductor wafer positioned within said predetermined area, thereby purging said wafer with said purge gas.

14. The system of claim 10, wherein said stack module comprises a quartz material.

15. The system of claim 11, wherein said process chamber liner comprises a quartz material.

16. The system of claim 11, wherein said process chamber liner presses against said window stack with a compressive force to from a seal therebetween.

17. The system of claim 10, wherein said window stack comprises a variable purge gas flow aperture to permit variations in gas flow through said stack module.

* * * * *